(12) United States Patent
Maxwell

(10) Patent No.: US 8,361,566 B2
(45) Date of Patent: Jan. 29, 2013

(54) METHOD OF FABRICATION OF FIBERS, TEXTILES AND COMPOSITE MATERIALS

(75) Inventor: James L. Maxwell, Jemex Springs, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 981 days.

(21) Appl. No.: 12/099,556

(22) Filed: Apr. 8, 2008

(65) Prior Publication Data

US 2010/0055352 A1    Mar. 4, 2010

(51) Int. Cl.
*C23C 16/48* (2006.01)

(52) U.S. Cl. ............... 427/586; 427/590; 427/596

(58) Field of Classification Search ........... 427/586, 427/588, 589, 596, 597, 590
See application file for complete search history.

(56) References Cited

U.S. PATENT DOCUMENTS

| | | | |
|---|---|---|---|
| 6,628,404 B1 * | 9/2003 | Kelley et al. | 356/502 |
| 6,833,086 B2 * | 12/2004 | Kajiwara | 252/301.6 S |
| 7,585,483 B2 * | 9/2009 | Edwin et al. | 423/447.3 |
| 2002/0057757 A1 * | 5/2002 | Khoury | 378/21 |
| 2002/0086528 A1 * | 7/2002 | Charneski et al. | 438/680 |
| 2002/0148961 A1 * | 10/2002 | Nakasuji et al. | 250/311 |
| 2003/0124717 A1 * | 7/2003 | Awano et al. | 435/287.2 |
| 2004/0184711 A1 * | 9/2004 | Bradley et al. | 385/16 |
| 2005/0009352 A1 * | 1/2005 | Crowder et al. | 438/689 |
| 2006/0275537 A1 * | 12/2006 | Maxwell et al. | 427/8 |

OTHER PUBLICATIONS

Wallenberger, Frederick T., et al., "Inorganic fibers and microstructures directly from the vapor phase". Composites Science and Technology, vol. 51 Issue 2, 1994, pp. 193-212. Abstract Only.*
Goodwin D.T., et al., A credible pathway for heavy ion driven target fabrication and injection, Laser and Particle Beams (2002), 20, 515-520, Cambridge University Press.
Maxwell, James L., et al, Process-Structure Map for Diamond-Like Carbon Filters from Ethene at Hyperbaric Pressures, Advanced Functional Materials (2005), 15, 1077-1087, Wiley-VCH Verlag GmbH & Co.
Maxwell, James L., et al., Preparation of superhard BxCy Fibers by microvortex-flow hyperbaric laser chemical vapor deposition, ScienceDirect (2007), 16, 1557-1564, Elsevier B.V.

* cited by examiner

*Primary Examiner* — Bret Chen
(74) *Attorney, Agent, or Firm* — Samuel Digirolamo; Husch Blackwell

(57) ABSTRACT

A method of growing a plurality of free-standing structures comprises providing a plurality of free-standing structures, each free-standing structure having a first end coupled to a substrate, and a terminal end; providing at least one laser beam, the laser beam having a beam waste at a point proximate to the terminal end of the free-standing structure; and moving one of the plurality of freestanding structures or the beam waste to provide a growth zone proximate to the terminal end of each of the free-standing structures such that the free-standing structures grow into the growth zones by addition of decomposing precursor components. The growth rates of each of the free-standing structures are substantially the same.

23 Claims, 7 Drawing Sheets

METHOD OF FABRICATION OF FIBERS, TEXTILES AND COMPOSITE MATERIALS

STATEMENT REGARDING FEDERAL RIGHTS

This invention was made with government support under Contract No. DE-AC52-06NA25396 awarded by the U.S. Department of Energy. The government has certain rights in the invention.

BACKGROUND OF INVENTION

The present application relates generally to free-standing structures including fibers. More particularly, the application relates to methods of growing fibers.

Fibers and other free-standing structures may be used in a variety of applications. For example, conventional fibers may be used in the formation of larger structures such as braided ropes, threads and other textiles. Fibers may also be used in composite materials such as reinforced polymeric structures. Fibers have also been used in telecommunications devices. More recently, fiber production methods and systems have been adapted to aid in the assembly of micro scale electro mechanical devices (MEMS). Even some nano-scale electro mechanical devices (NEMS) provide applications for specialty fibers.

While many synthetic fibers may be manufactured in bulk by conventional processes, some specialty materials do not lend themselves to such production methods. For example, some fiber materials may be drawn from a reaction mixture. The resulting fiber material may then be cut or chopped to a desired length. Alternatively, a long piece of fiber material may be wound or spooled as a single fiber. Such techniques, however, are not useful for the preparation of fibers or assemblies of fibers comprising more brittle materials. Also, while some materials may be synthesized according to conventional techniques, the conditions under which the processing must be performed often limits the ability to produce fibers having desired properties or morphologies. Because of this, many potentially useful fiber materials have not yet been realized.

The geometry and surface properties of the produced fibers is also important. It is very difficult to manually (or even automatically) assemble MEMS or NEMS from fibers that are sufficiently small for these applications. While devices have been proposed for orienting, positioning, and assembling fibers in such devices, mass-production of large quantities of fiber-based MEMS/NEMS has proven impractical or costly.

Accordingly, it would be desirable to provide a method for the production of fibers and structures comprising fibers, utilizing specialized materials. It would also be desirable to provide a method for controlling the growth rate of an array of fibers such that the fibers may be formed into larger structures as the fibers are grown. These and other aspects, advantages, and features will become apparent from the following detailed description, the accompanying drawings, and the appended claims.

SUMMARY OF INVENTION

One embodiment of the invention relates to a method of growing a plurality of free-standing structures. The method comprises providing a plurality of free-standing structures, each free-standing structure having a first end coupled to a substrate, and a terminal end; providing at least one laser beam, the laser beam having a beam waist at a point proximate to the terminal end of the free-standing structure; and moving one of the plurality of freestanding structures or the beam waist to provide a growth zone proximate to the terminal end of each of the free-standing structures such that the free-standing structures grow into the growth zones by addition of decomposing precursor gas components. The growth rates of each of the free-standing structures are substantially the same.

DETAILED DESCRIPTION OF INVENTION

Figure 1A:
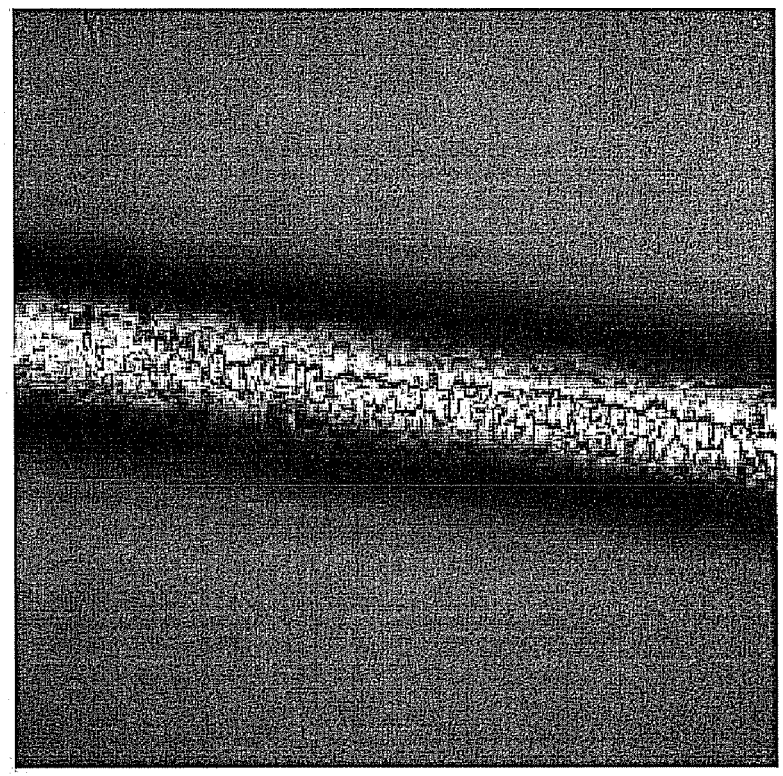
FIGS. 1(a)-(d) are images of fibers.
Figure 1B:
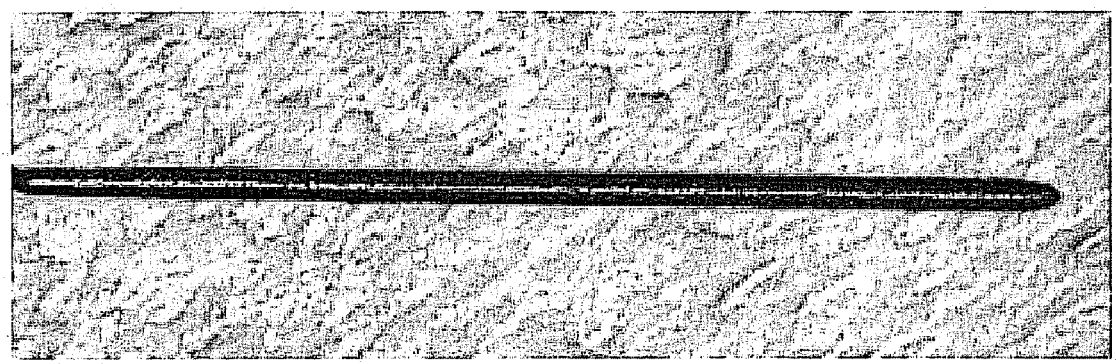
Figure 1C:
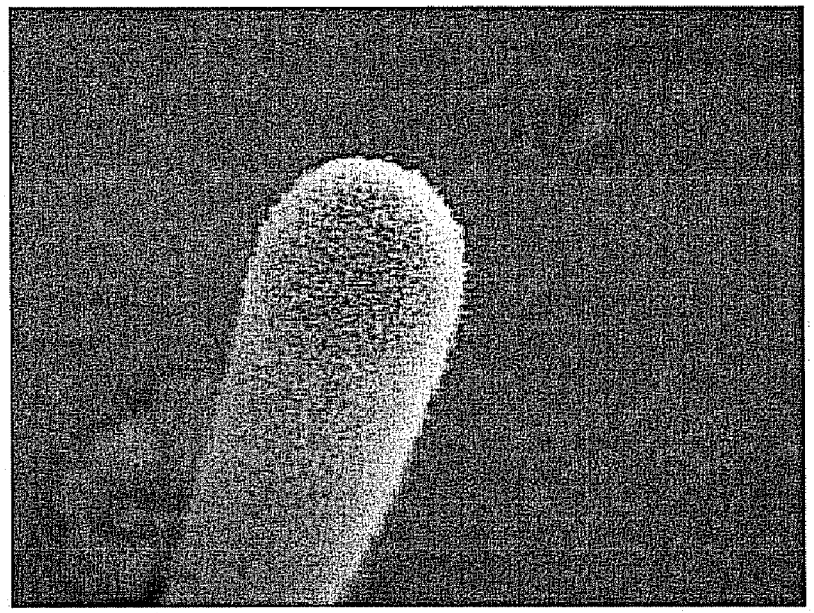
Figure 1D:
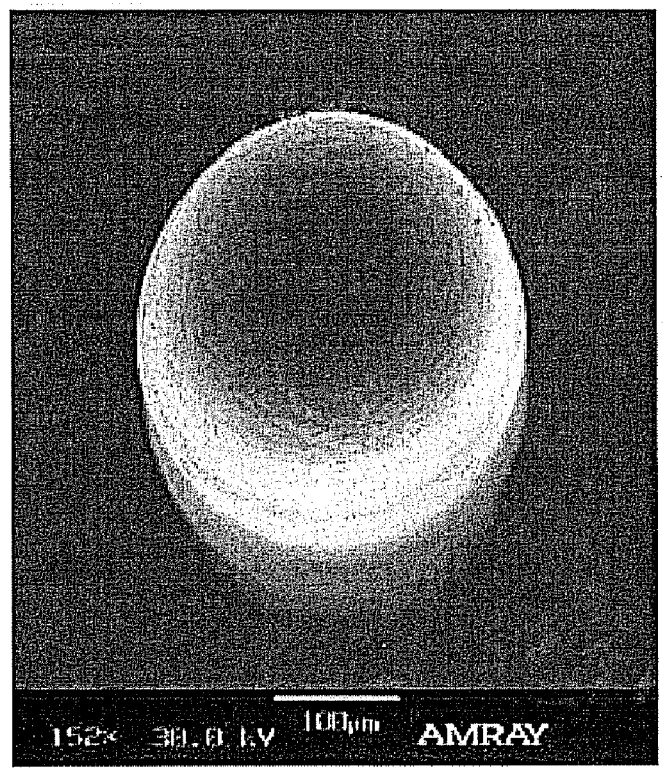

While laser chemical vapor deposition had been in general use for many years, the growth of three-dimensional structures, such as fibers, and, in particular fiber arrays, is a relatively new and important emerging technology. Referring to the drawings, FIG. 1(a) is a boron carbide fiber grown in a freeform manner by hyperbaric laser chemical vapor deposition; the solid fiber grows in the direction of the laser beam by decomposing gas phase precursors for both boron and carbon at a laser focus. The growth zone may generally be considered the region of the beam proximate to the beam waist where the beam intensity is sufficient for fiber growth. The area proximate to the beam waist may be positioned at the fiber tip to provide the fiber growth zone. As precursor material enters this intense region of the beam, the materials react and a deposit is added to the fiber tip. To vary the geometry of a fiber, the growth zone may be moved relative to the fiber tip. For example, the growth zone may be moved longitudinally along the major axis of the fiber to provide a roughly straight fiber. Alternatively, the growth zone may be moved transversely or in another direction to form a fiber having a curved or angled geometry. This allows curved fibers, tapered fibers, and even "dog-bone-shaped" fibers to be grown.

Observe that the fibers of FIG. 1 have a fine polycrystalline or amorphous microstructure. Not only is the boron carbide fiber of FIG. 1(a) extremely hard (Vickers hardness>40 GPa), but the fibers are flexible and difficult to fracture. FIG. 1(b) shows a fiber of a particular boron-carbon-silicon alloy, grown in a similar manner. FIG. 1(c) and FIG. 1(d) are micrographs of a tungsten-silicide fiber and a pure titanium fiber, grown similarly. These fibers were grown by the inventors to demonstrate that extremely hard and/or normally brittle materials can be grown by HP-LCVD in a manner that they have great "engineered" flexibility—in the same way that fiber optics, while made of a brittle glass, become highly flexible when the ratio of their length to diameter is very small, in particular for diameters less than 0.5 mm. In addition, the materials are grown in a manner that they have small (interconnected) grains (or no grain boundaries at all) without nano/microcracks or slip planes that would permit fracture propagation and growth. Thus the materials have greater fracture strength than fibers produced by other methods. Finally, the fibers were grown at relatively rapid rates, ranging from a few microns per second to millimeters per second.

These basic improvements to the state of the art were possible through several novel changes to the usual laser chemical vapor deposition (LCVD) approach. While conventional LCVD is conducted at low pressures (typically <<1 bar), the inventors have discovered that increased pressures, such as utilized in the present method, provide for faster growth rates than previously observed. Previously, relatively high pressures have been avoided due to concerns of homogeneous nucleation of the precursor material in regions outside of the fiber growth zones. As shown in Maxwell et al., *Process-Structure Map for Diamond-Like Carbon Fibers at Hyperbaric Pressures*,Advanced Functional Materials, volume 15,pp 1077-1087 (2005) (the contents of which are hereby incorporated herein in its entirety), the axial (and mass) growth rates of carbon fibers have been shown to dramatically increase with an increase in precursor pressure. In particular, favorable results have been achieved at pressures greater than one bar, and in particular in the range of about 2 to 5 bars. The fibers grown at higher pressures have had generally more amorphous morphologies which results in higher fracture strengths and greater toughness. However, by utilizing a finely-focused beam, at a wavelength that does not interact with the gas-phase precursor, homogeneous nucleation can be reduced, allowing rapid fiber growth at high precursor pressures. The material properties also improve with increasing pressure, as the grain sizes generally decrease with pressure. In addition, the ability to control the fiber diameter increases dramatically with increasing pressure, as there is greater ability to transport heat and precursors/byproducts to and from the growth zone. Finally, the cost per fiber length decreases rapidly with increasing pressure, as the axial growth rates increases. Hence, hyperbaric laser chemical vapor deposition is becoming a viable technology for producing fibers of many inorganic and organic materials, with fine microstructure and novel, improved material compositions and properties.

The focus of this invention is that, with the aid of advanced optics and other methods, including the use of diffractive optics, not just one, but a plurality of fibers can be grown—and most importantly, the entire array is grown in a controlled manner, whereby all the fibers grow together at a common growth front, be that along a line, a plane, or other curvilinear surface. To our knowledge, previous attempts to grow fibers in-parallel have been unsuccessful, as each individual fiber can initiate at slightly different times, and/or each fiber can have difference average growth rates—allowing their lengths to diverge over time. In the kinetically-limited regimes, for example, small differences in incident power at each fiber will result in vastly different growth rates. Hence the inventors have discovered that operating within the mass-transport limited regime is a great aid to controlling the overall growth front. However, by itself, this does not stabilize the growth front.

Figure 2:
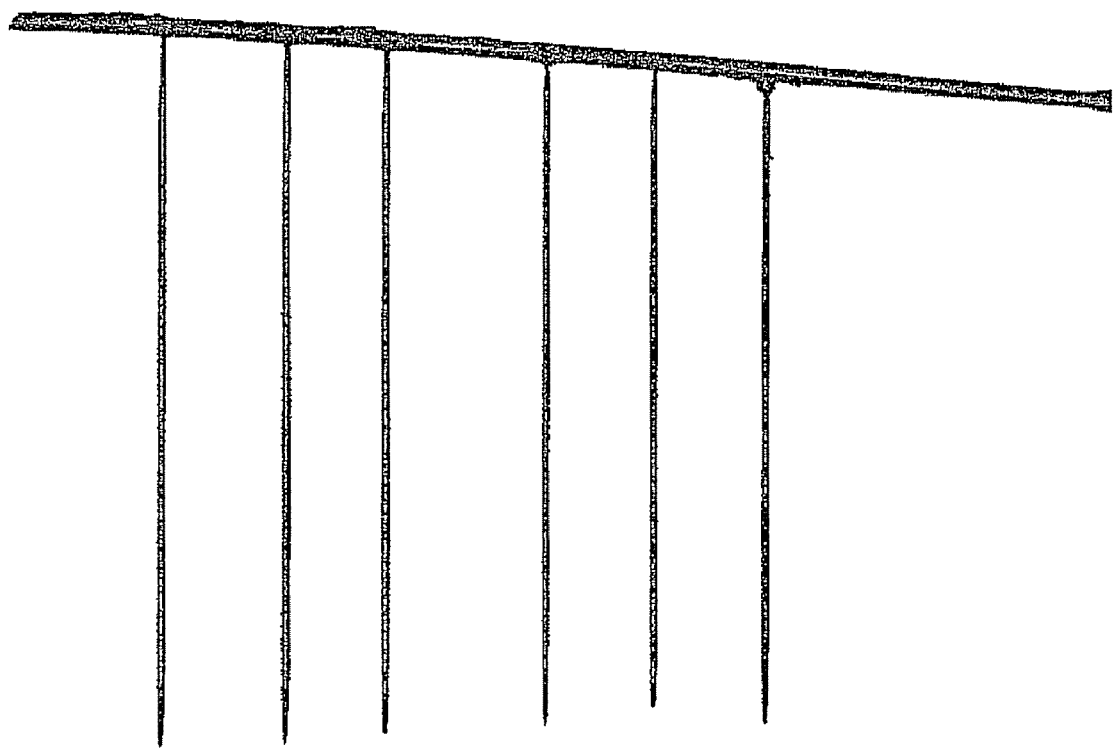
FIG. 2 is an image of a fiber array.

FIG. 2 shows a linear array of carbon fibers grown from ethylene gas (the precursor); the reaction chamber was at a pressure of about 1 bar. These fibers were grown in steps using a scanning laser, where a portion of one fiber was grown, and then the laser was scanned to the next, etc., until all the fibers were grown to a similar length. The high speed scanning laser provided pulses of 532 nm light with a localized intensity >0.16 mW/micron^2 at each fiber growth zone. The average energy within the growth zones was sufficient to maintain growth at each of the fiber tips. FIG. 2(*b*) shows a two-dimensional array of fibers grown by the inventors using HP-LCVD whereby the individual fibers were grown one-at-a-time, to predetermined lengths; The fibers shown are about 40 to 50 microns in diameter, while the longest fibers were approximately 1 mm long—and the entire array was grown in about 2 minutes (note, however, that at higher pressures growth rates of up to about 13 cm/sec have been realized, allowing such an array to be completed in just a few seconds). Most importantly, the individual fiber lengths in this array could be controlled by interferometric measurements, using the interference of light reflecting from the fiber tip with that of the incident laser beam. They could also be controlled using tracking devices and CCD microscopes to measure the location of the fiber tips while they were grown. However, a key point is that these measurements were made to ensure that the overall structure was grown to a particular "growth front."

Most importantly, methods for controlling the growth front have not been addressed, and, in fact, the inventors have been the first to demonstrate the growth of a plurality of fibers "in-parallel," rather than "in-series," and they have developed several new methods for controlling the growth rates of fibers that are evolving in-parallel—such that all the fibers grow together with similar rates and reaction zone locations (or to predetermined height differences). Without these additional methods, uncontrolled parallel growth is useless, as large-scale structures cannot be completed—the relative rates are unstable, and eventually only one fiber will still be growing; growing a long rope/cable, or weaving a sizeable cloth of many fibers, for example, would not be feasible.

The creation of large scale woven structures has diverse applications; for example lightweight, high strength materials could be manufactured for boat sails, bulletproof vests, and aerospace composites (e.g. for reinforcing airframes and turbine components). Hence, this application focuses on the techniques that make Hyperbaric LCVD practical for the continuous growth of many fibers in-parallel over long lengths, as needed for the production of useful materials such as rope/cable, cloth, composite lay-ups, etc.

Figure 3:
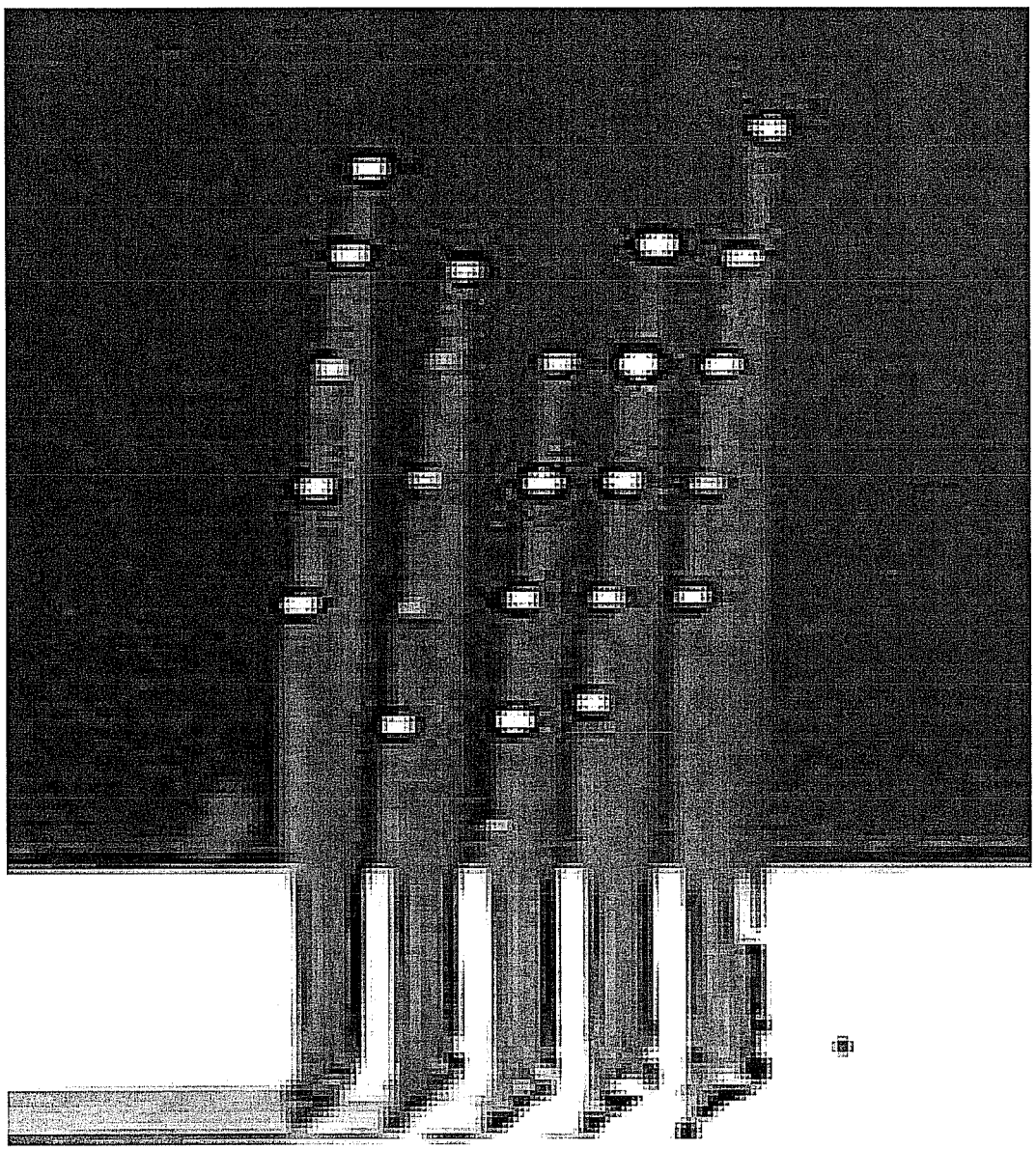
FIG. 3 is an image of another fiber array

FIG. 3 shows an example of controlled growth of a fiber array, by carefully controlling the growth front, using: (1) a very short focal length focusing lens, (2) use of a diffractive optic in conjunction with this lens, and (3) the use of mass-transport limited conditions. It is the combination of these three conditions which allows for controlled growth, such that the fibers grow to similar heights at similar times. For example, as the fibers grow, the focal plane is scanned backward, at a rate lower than the slowest fiber in the array. If any fiber grows too rapidly, it moves ahead of the optimal focus, cools, and the growth temporarily ceases at this fiber until the laser focus advances. This is just the most basic of several methods that have been developed for controlling the growth front.

A more sophisticated approach is the use of two beams, at least one of which involves an interferometer that produces a region of constructive interference of the laser light at the growth zone. A second beam is passed through a series of beam splitters or diffractive optical element(s) to produce multiple laser foci at the region of constructive interference from the first beam. The combination of the two beams at the laser foci enables fiber growth within the region of constructive interference, but outside of this region, the laser power is insufficient to produce fiber growth. As a result, fibers initiated within this region will grow only up to the point where they leave the region of constructive interference, then growth ceases. By scanning the region of constructive interference backwards as the fibers grow, the fibers will all grow at the scan rate, provided this rate is sufficiently slow to not leave any fibers behind. This method is illustrated in FIG. 4, where the planar regions of constructive interference as shown, as well as the multiple laser foci from the second beam.

Figure 4:
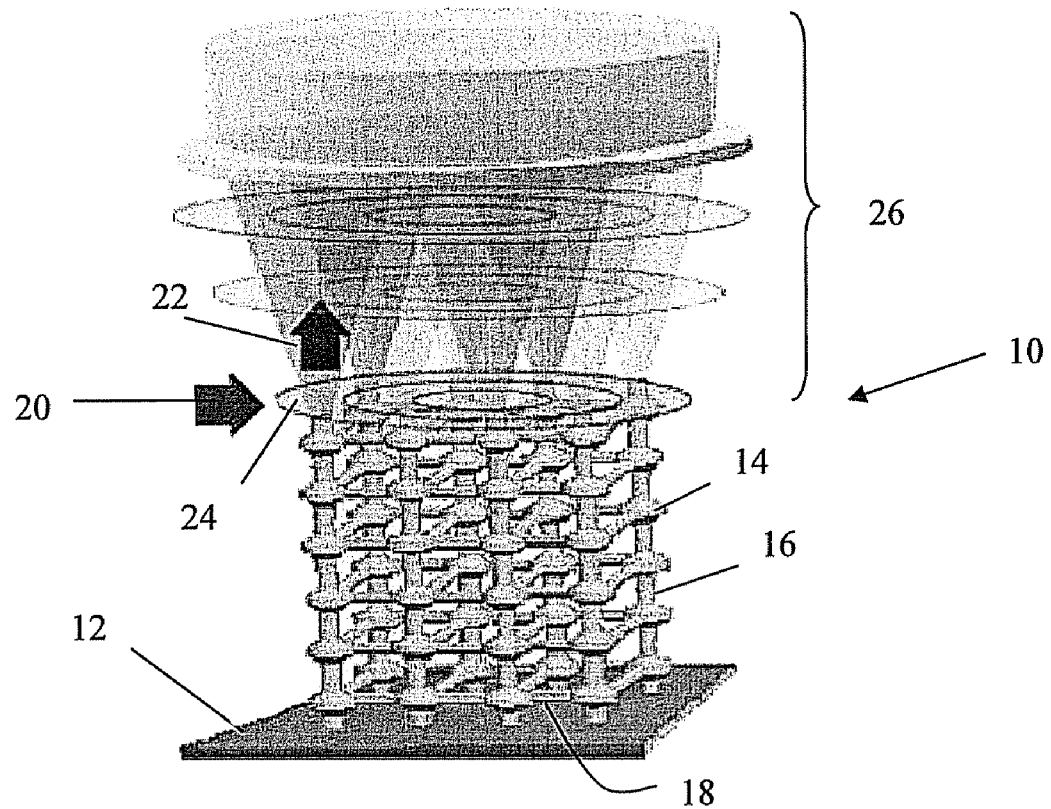
FIG. 4 is a schematic image of a three-dimensional structure comprising fibers grown simultaneously.

As shown in FIG. 4, a three dimensional structure 10 is grown from a substrate 12. The structure 10 includes a plurality of junctions 14, vertical struts 16 and horizontal struts 18. The direction of growth is shown by arrow 20, while the direction of precursor gas flow is shown by arrow 22. One of the planes of constructive interference 24 provides a growth zone below zone 26. The advantage of this method is that the region of growth can be limited to the a very narrow width along the direction of growth—and this width can be determined by the laser light wavelength employed. Using a $CO_2$ laser at 10.6 micron wavelength, for instance, the width of the constructive interference region would be at most 5-10 microns. This allows much greater resolution and control than the use of short focal length optics (described earlier).

Figure 5:
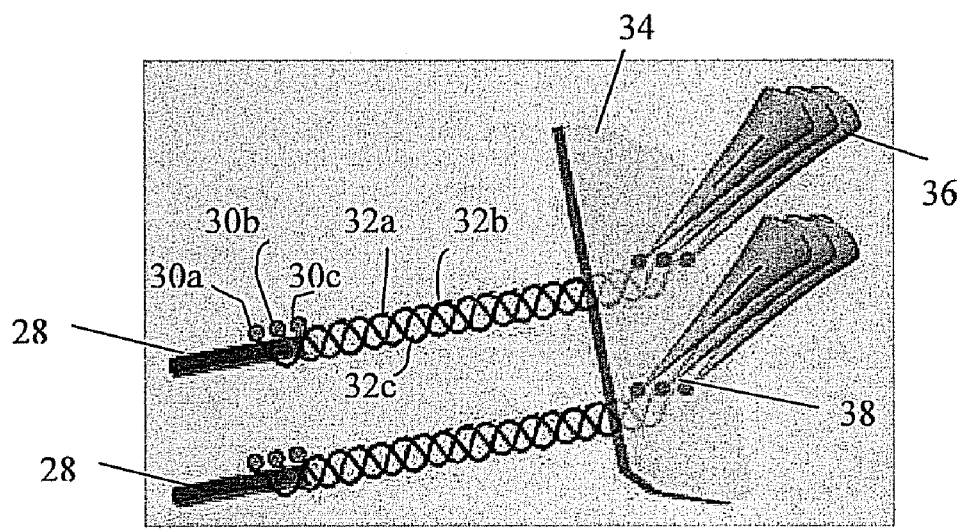
FIG. 5 is a schematic image of a system for growing braided fibers.

The most important aspect of this invention is the scanning of multiple beams or arrays of beams to laser "braid" or "weave" long fibers simultaneously to produce rope/cables, cloth, and composite near net shapes; these can also be composed of fibers that cannot be produced in any other way, such as refractory metal carbides, nitrides, and borides. Several implementations of this invention are illustrated in FIGS. 5-9. In FIG. 5, two or more focused laser beams are scanned independently to produce a braided rope, as the fibers are grown.

As shown in FIG. 5, a substrate includes initiation points 30(a) 30(b) and 30(c). Fibers 32(a) 32(b) and 32(c) extend from the initiation points to a growth plane where the fibers are being added to. Beams 36 provide foci 38 in the growth plane such that the fibers 32 grow into the direction of the beam.

Alternatively, two or more diffractive optics are rotated relative to each other in a laser beam, thereby scanning two or more arrays of laser foci relative to each other, causing the evolving fibers to be intertwined into rope/cables as they are grown.

Figure 6:
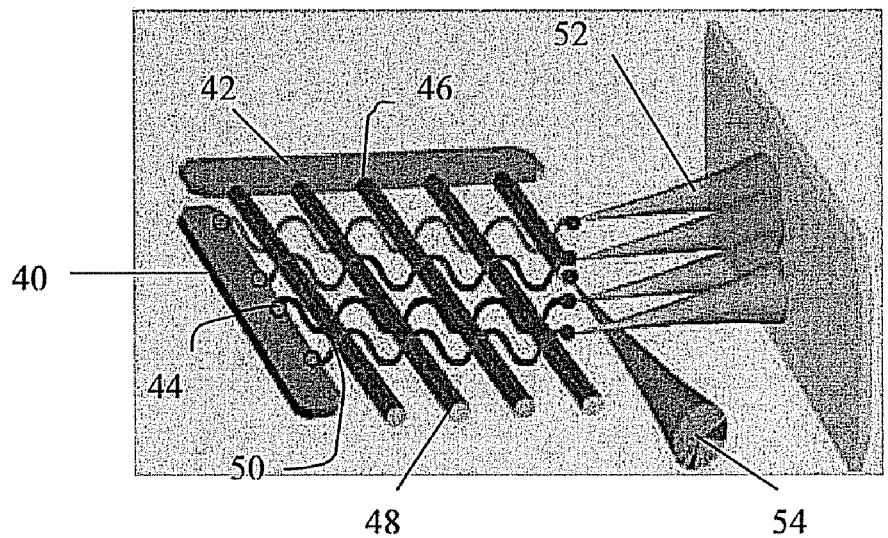
FIG. 6 is a schematic image of a system for growing a woven article.

As shown in FIG. 6, substrates 40 and 42 may be provided with initiation points 44 and 46 respectively. Fibers 48 may be grown away from substrate 42 and be intertwined with fibers grown away from substrate 40 to provide a woven structure. Beams 52 and 54 may be used simultaneously to grow the woven material.

In FIG. 6, multiple beams are used to grow an array of fibers perpendicular to a second fiber or array of fibers, such that a cloth structure is laser grown.

Figure 7:
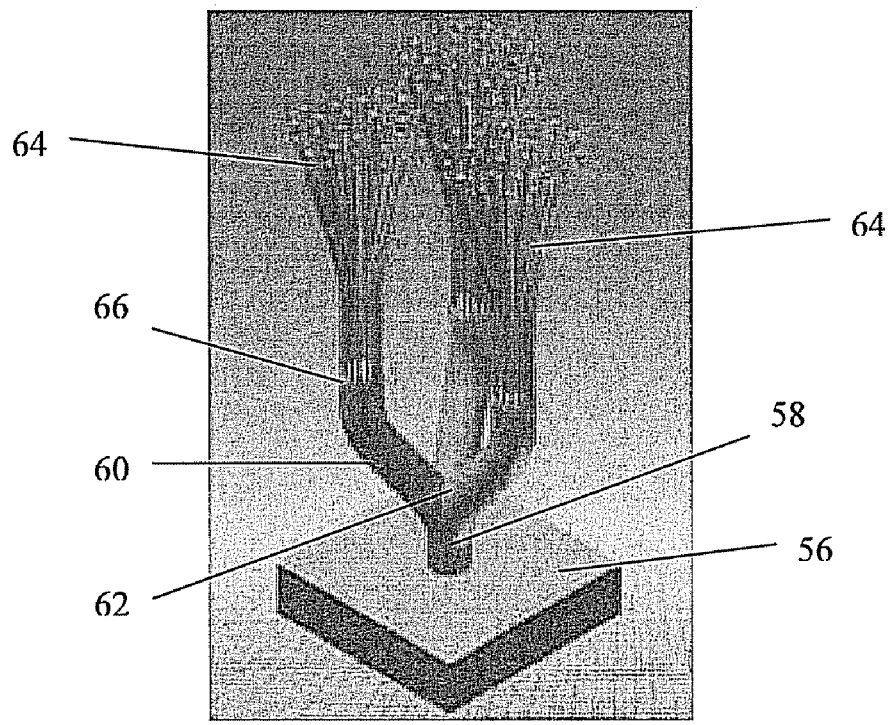
FIG. 7 is a perspective view of a multi jointed fiber tree.

FIG. 7 illustrates the concept of joining fibers and/or splitting fibers to/from junctions allowing fibers within a rope, cable, cloth, or composite near-net shape to be connected periodically at junctions. A substrate 54 may be provided from which a first fiber trunk 56 is grown. The first fiber trunk 56 may be split a joint 58 into secondary trunks 60 at joint 62. Yet another tertiary level of fibers 64 may be split from the secondary trunks 60 at joints 66. The use of this technique may be done in conjunction with other techniques disclosed for weaving the fibers as they are grown. This technique greatly increases the strength of ropes, cables, cloth, etc., by: (1) distributing loads from one fiber to other fibers, and by: (2) preventing stranding or "pull-out" of individual fibers from the body of the structure. It also allows truss-like lattices to be created, for small-scale ultra-light weight materials and support structures (e.g. for airframes or satellite antennae). The fibers are joined or split as they are grown, so that in reality, they are a single, uniform, continuous piece of material, not two or more separate fibers bonded after the fact. This greatly increases the fracture strength of the body of the structure, as the full tensile strength of the material can be used, rather than the adhesion/bonding strength at a junction. It also eliminates cracks and fracture planes that can grow to compromise an entire structure. At the same time, the use of junctions can be optimized to maintain the flexibility of the overall structure while increasing the fracture strength.

Figure 8:
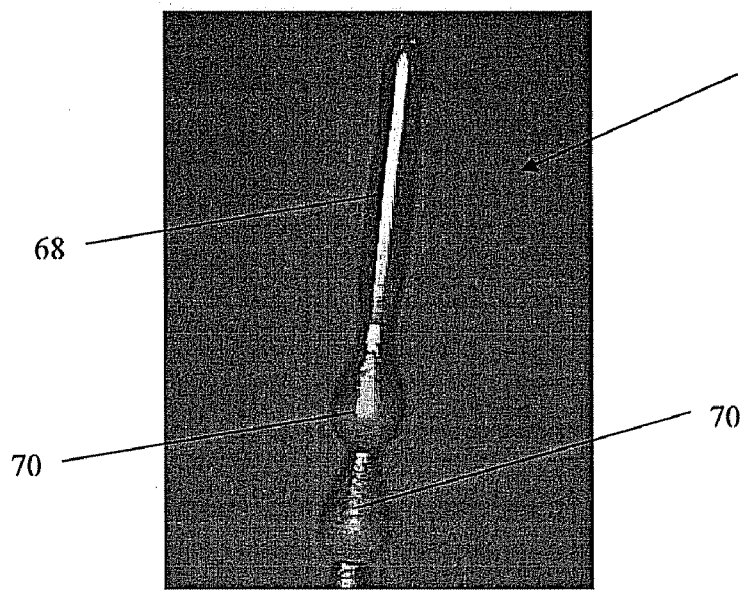
FIG. 8 is an image of a fiber.
Figure 9:
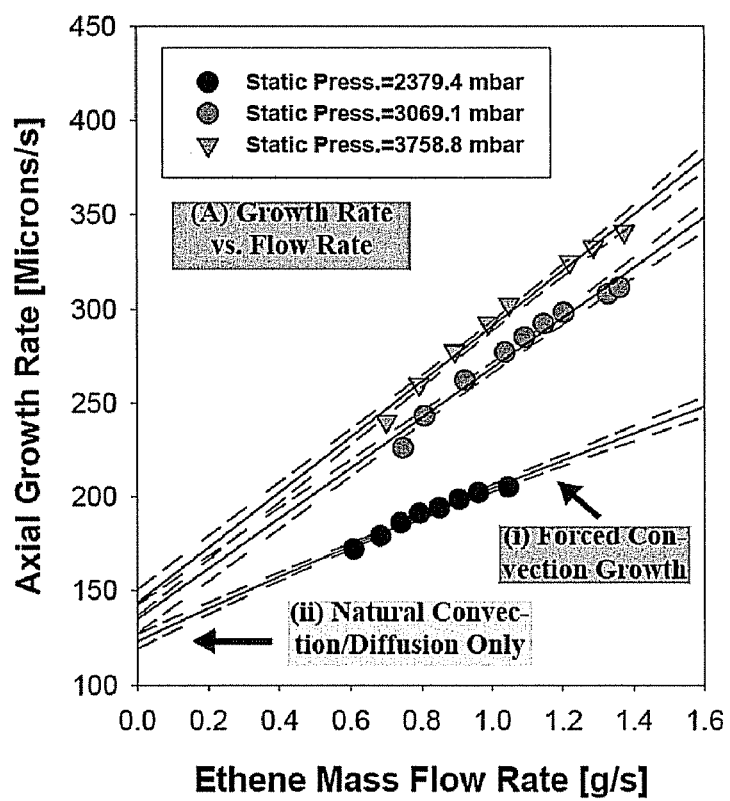
FIG. 9 is a chart showing the growth rate of various fibers as a function of precursor gas flow rates.

FIG. 8 shows how "dog-bone" shaped or "bed-post" shaped fibers can be grown within a rope/cable, cloth, or composite near-net shape to prevent "pull-out" of fibers from the overall structure or composite matrix, by allowing other materials to bind/bond at or within the concave regions; in this case, the larger diameter sections essentially act like rivets, that limit motion and pin the location of the fiber(s) relative to other portions of the structure/composite. These shapes would be extremely difficult (if not impossible) to produce through standard fiber/wire drawing or extrusion techniques, yet would be extremely useful for preventing pull-out, greatly increasing the ultimate strength of rope/cable, cloth, or composite near-net shapes. The fiber 66 includes a generally straight terminal end 68 with a plurality of regions 70 having a greater nominal diameter than the terminal end.

The primary advantage of the laser "braiding" or "weaving" techniques described above is that the fibers are grown into their nominal shapes within the cable or cloth structures, rather than bent to fit within a braided or weaved shape. Thus, more brittle, refractory materials that normally cannot be drawn and braided into cables can be formed into their desired fiber shape as they are grown. For example, titanium, tungsten, tantalum, zirconium, rhenium (and their carbides, nitrides, borides, etc.) can be grown for the first time into useful high-strength cables that can withstand high-temperatures, corrosive environments, etc. The cross-section of individual fibers within these cables would be solid titanium, tungsten, etc., rather than merely coatings over other fibers/wires. This allows the full thermo physical and mechanical properties of these materials to be exploited in the form of ropes, cables, cloth, etc.

There are several additional methods for controlling the growth front: Rather than control the intensity of the laser spots, one can also control the availability or transport of precursors to the growth zone.

(A) Through ultrasonics, one can create standing or dynamic acoustic waves within the chamber, ranging from nanometer to millimeter widths, where the precursor is concentrated within the growth zone, but is rarified elsewhere. This inhibits growth of the fibers outside of the higher concentration regions, and helps the individual fibers to grow at a common axial rate—which is the rate at which the standing waves are drawn backward from the evolving rope/cable. Reactants and byproducts of the reaction can also be separated through such acoustic waves, allowing enhanced growth rates where the precursor is concentrated, and diminished growth where by-products and/or inert gases are present.

(B) Alternatively, a jet of gas, shaped to a desired profile, can be passed at a desired angle to the growing fiber arrays. The inventors have shown that growth rates can be enhanced many times through the forced flow of precursor past the growth zone. For example, a planar jet of precursor gas can be passed across the fiber array growth zone; outside of this growth zone, the deposition rate would be greatly diminished. Thus, the array growth front can be controlled by scanning the precursor jet backward, and the fibers would grow primarily within this jet. The growth zone can be further defined by passing a "coaxial" or "coplanar" flow of precursor within bounding jets of an inert gas. In this case, growth will be greatly diminished within the inert gas, providing little/no mixing occurs between the two gases before the gases pass the fiber array.

(C) A similar effect is achieved if the array growth zone is held at the center of an aperture in a plate or similar shape, with precursor gas flow through the aperture, but much reduced gas velocities on either side of the aperture. As the precursor moves through the hole from one region to another, the flow rate (and mass transport) is enhanced at the aperture, but is diminished otherwise. By translating the array, to maintain the slowest fiber at the surface of the aperture, the growth front will be maintained roughly at the hole. This can be further enhanced as the hole diameter becomes small, and as inert gas flows are used in conjunction with this aperture method.

(D) While the concept of field-emission laser chemical vapor deposition is the subject of another patent (pending), with proper selection of electrode geometries, a converging-diverging concentration of precursors/reactants can be generated at the array growth zone, enhancing the growth rates of fibers within this region of enhanced concentration. This technique can be combined with the aperture method described above to create a highly efficient method of controlling the array growth front.

According to the forgoing methods, a variety of practical improvements may be possible over past processes. The manufacture of complex shaped articles and fibers from previously unworkable materials is made possible. Also, the use of existing materials may yield higher strength articles and fibers than previously possible. Lastly, the techniques for growing fibers and other articles at higher pressures may reduce production costs while increasing growth rates.

Many changes, modifications, variations and other uses and applications of the present invention will, however, become apparent to those skilled in the art after considering this specification and the accompanying drawings. All such drawings, modifications, variations and other uses and applications which do not depart from the spirit and scope of the present invention are deemed to be covered by the present invention which is limited by the claims which follow.

What is claimed is:

1. A method of growing a plurality of free-standing structures comprising:
   providing a plurality of free-standing structures, each free-standing structure having a first end coupled to a substrate, and a terminal end;
   providing at least one laser beam, the laser beam having a beam waist at a point proximate to the terminal end of the free-standing structure;
   moving one of the plurality of free-standing structures or the beam waist to provide a growth zone proximate to the terminal end of each of the free-standing structures such that the free-standing structures grow into the growth zones by addition of decomposing precursor gas components;
   maintaining growth rates of each of the free-standing structures substantially the same in-parallel in a state of mass-transport limitation by limiting the amount of precursor gas components supplied to the growth zone to rate-limit growth of the free-standing structures.

2. The method of claim 1, wherein the precursor gas components are supplied to the growth zone but depleted in regions immediately outside the growth zone.

3. The method of claim 1, wherein the precursor gas components are supplied in jets and sheets to the growth zone but depleted in regions immediately outside the growth zone.

4. The method of claim 1, wherein an inert gas is supplied to regions immediately outside the growth zone to displace the precursor gas component in said regions.

5. The method of claim 1, wherein supply of precursor gas components to the growth zone is controlled based upon measurements of the relative location, temperature, and/or growth rate of each free-standing structure.

6. The method of claim 1, wherein supply of precursor gas components is controlled based on measurements of the relative precursor gas concentrations within the growth zone.

7. The method of claim 1, wherein supply of precursor gas components for each free-standing structure is controlled independently.

8. The method of claim 1, wherein acoustic waves are used to concentrate precursor gas components inside the growth zone and deplete precursor gas components in regions immediately outside the growth zone.

9. The method of claim 1, wherein the method is conducted at a precursor gas pressure of at least about 8 bar.

10. The method of claim 1, further comprising the step of providing a substrate including a seed material prior to the step of providing the at least one laser beam.

11. The method of claim 10, wherein the seed material comprises a material substantially similar to the fiber.

12. The method of claim 10, wherein the seed material is a carbon fullerene.

13. A method of growing a plurality of free-standing structures comprising:
    providing a plurality of free-standing structures, each free-standing structure having a first end coupled to a substrate, and a terminal end;
    providing at least one precursor gas at a total pressure greater than 1 bar;
    providing a laser beam split into a plurality of beamlets, each of the plurality of beamlets having a beam waist at a point proximate to the terminal end of one of the plurality of free-standing structures;
    positioning at least one of the plurality of freestanding structures or at least one of the beam waists to provide a growth zone proximate to the terminal end of the at least one of the plurality of free-standing structures such that the free-standing structures grow into the growth zones by addition of decomposing precursor gas components;
    adjusting the intensity of at least one of the beamlets based upon measurements of the relative location, temperature, and/or growth rate of each free-standing structure so as to maintain the growth rates of each of the free-standing structures substantially the same.

14. The method of claim 13, wherein the growth zone is limited in spatial extent by limiting the Rayleigh range of the beamlets.

15. The method of claim 13, wherein two or more beamlets constructively interfere at the growth zone to enhance growth rates within the growth zone, but destructively interfere outside the growth zone.

16. The method of claim 13, wherein the intensity of beamlets within the growth zone is at least partially enhanced by use of a second coaxial beam or lamp-derived beam.

17. The method of claim 13, wherein the intensity of beamlets within the growth zone is at least partially enhanced by use of one or more coaxial interferometer.

18. The method of claim 13, wherein the intensity of at least one of the beamlets is controlled based on measurements from a camera.

19. The method of claim 13, wherein the intensity or dwell time of the beamlets is controlled using electro-optic arrays, shutters or mirror arrays.

20. The method of claim 13, wherein the beamlets are moved as the free-standing structures grow to intertwine, braid, or weave the free-standing structures.

21. The method of claim 13, wherein the two or more sets of beamlets are moved as the free-standing structures grow to intertwine, braid, or weave the free-standing structures.

22. The method of claim 13, further comprising the step of providing a substrate including a seed material prior to the step of providing the at least one laser beam.

23. The method of claim 22, wherein the seed material comprises a material substantially similar to the fiber.

* * * * *